United States Patent
Zhou et al.

(10) Patent No.: US 11,121,344 B2
(45) Date of Patent: Sep. 14, 2021

(54) ORGANIC ELECTROLUMINESCENT DEVICE

(71) Applicant: YUNGU (GU'AN) TECHNOLOGY CO., LTD., Langfang (CN)

(72) Inventors: Xiaokang Zhou, Langfang (CN); Mengzhen Li, Langfang (CN); Lin He, Langfang (CN); Weiwei Li, Langfang (CN); Hui Pang, Langfang (CN); Tiantian Li, Langfang (CN); Jingwen Tian, Langfang (CN); Xiaoyu Gao, Langfang (CN); Xiuqi Huang, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 152 days.

(21) Appl. No.: 16/731,069

(22) Filed: Dec. 31, 2019

(65) Prior Publication Data

US 2020/0144549 A1 May 7, 2020

Related U.S. Application Data

(63) Continuation of application No. PCT/CN2018/106347, filed on Sep. 19, 2018.

(30) Foreign Application Priority Data

May 16, 2018 (CN) .......................... 201810469474.9

(51) Int. Cl.
*H01L 51/52* (2006.01)
*H01L 27/32* (2006.01)
(Continued)

(52) U.S. Cl.
CPC ........ *H01L 51/5265* (2013.01); *H01L 27/322* (2013.01); *H01L 27/3211* (2013.01);
(Continued)

(58) Field of Classification Search
CPC ............... H01L 51/5265; H01L 27/322; H01L 51/0081; H01L 51/5234
See application file for complete search history.

(56) References Cited

U.S. PATENT DOCUMENTS

| 7,564,182 B2 | 7/2009 | Boroson et al. |
| 2005/0067954 A1 | 3/2005 | Nishikawa et al. |
| (Continued) | | |

FOREIGN PATENT DOCUMENTS

| CN | 1604703 A | 4/2005 |
| CN | 101452999 A | 6/2009 |
| (Continued) | | |

OTHER PUBLICATIONS

Written Opinion of International Application No. PCT/CN2018/106347.
(Continued)

*Primary Examiner* — Anthony Ho
(74) *Attorney, Agent, or Firm* — Kilpatrick Townsend & Stockton LLP

(57) ABSTRACT

The present application discloses an organic electroluminescent device that includes a plurality of kinds of light-emitting units having different light-emitting wavelengths, wherein the light-emitting units are organic light-emitting diodes, the organic light-emitting diodes include a plurality of single-colored organic light-emitting diodes and/or a plurality of white-light organic light-emitting diodes provided with optical filters; at least one kind of the organic light-emitting diodes has a microcavity structure; a microcavity optical length Li of the organic light-emitting diode having the microcavity structure and a light-emitting wavelength λi of the corresponding light-emitting unit meet the following formula: Li=niλi, wherein ni≥2, ni is a positive integer, and the ni corresponding to at least one of the plurality of kinds of light-emitting units having different light-emitting wavelengths λi is larger than or equal to 3; m is the number of the kinds of the light-emitting units, m≥i≥1, i and m are positive integers.

20 Claims, 8 Drawing Sheets

(51) Int. Cl.
*H01L 51/00* (2006.01)
*H01L 51/50* (2006.01)

(52) U.S. Cl.
CPC ...... *H01L 51/0065* (2013.01); *H01L 51/0072* (2013.01); *H01L 51/0073* (2013.01); *H01L 51/0081* (2013.01); *H01L 51/5012* (2013.01); *H01L 51/5218* (2013.01); *H01L 51/5234* (2013.01); *H01L 2251/305* (2013.01); *H01L 2251/308* (2013.01); *H01L 2251/558* (2013.01)

(56) References Cited

U.S. PATENT DOCUMENTS

| | | |
|---|---|---|
| 2009/0015141 A1 | 1/2009 | Wang |
| 2009/0115706 A1 | 5/2009 | Hwang et al. |
| 2010/0156280 A1 | 6/2010 | Song et al. |
| 2012/0261685 A1 | 10/2012 | Asaki et al. |
| 2012/0273822 A1 | 11/2012 | Ohsawa et al. |
| 2014/0027732 A1 | 1/2014 | Pyo et al. |
| 2014/0077185 A1 | 3/2014 | Lee et al. |
| 2014/0167015 A1 | 6/2014 | Lee et al. |
| 2014/0353597 A1 | 12/2014 | Ahn |
| 2015/0340410 A1 | 11/2015 | Hack et al. |
| 2016/0343949 A1 | 11/2016 | Seo et al. |
| 2017/0179435 A1 | 6/2017 | Seo et al. |
| 2017/0317308 A1 | 11/2017 | Wang et al. |
| 2017/0330919 A1 | 11/2017 | Lee et al. |
| 2018/0108713 A1 | 4/2018 | Hatano |
| 2018/0108847 A1 | 4/2018 | Suzuki et al. |
| 2019/0088882 A1 | 3/2019 | Seo et al. |

FOREIGN PATENT DOCUMENTS

| | | |
|---|---|---|
| CN | 102738409 A | 10/2012 |
| CN | 103000638 A | 3/2013 |
| CN | 103579522 A | 2/2014 |
| CN | 103681747 A | 3/2014 |
| CN | 103872088 A | 6/2014 |
| CN | 107634084 A | 6/2014 |
| CN | 104600097 A | 5/2015 |
| CN | 107275362 A | 10/2017 |
| CN | 107534090 A | 1/2018 |
| CN | 107768532 A | 3/2018 |
| CN | 108511628 A | 9/2018 |
| CN | 208489238 U | 2/2019 |
| JP | 2011142106 A | 7/2011 |
| JP | 2017126598 A | 7/2017 |
| JP | 2018065798 A | 4/2018 |

OTHER PUBLICATIONS

Search Report of International Application No. PCT/CN2018/106347.
First Office Action of Chinese Application No. 201810469474.9.
Second Office Action of Chinese Application No. 201810469474.9.
First Office Action of Taiwan Application No. 107133483.
Extended Search Report of European Application No. 18919203.2.
Baek-Woon Lee et al: "Micro-cavity design of bottom-emitting AMOLED with white OLED and RGBW color filters for 100% color gamut".
Yanfeng Dai et al: "Highly efficient and stable tandem organic light-emitting devices based on HAT-CN/HAT-CN: TAPC as a charge generation layer".
Kwon-Hyeon Kim et al: "Origin and Control of Orientation of Phosphorescent and TADF Dyes for High-Efficiency OLEDs".
Ji Wenyu et al: "High-color-rendering flexible top-emitting warm-white organic light emitting diode with a transparent multilayer cathode".
First Office Action of Japanese Application No. 2020-526668.
Fourth Office Action of Chinese Application No. 2018104694749.
CN Third Office Action dated Mar. 11, 2020 in the corresponding CN application (application No. 20181046947.9).

ORGANIC ELECTROLUMINESCENT DEVICE

CROSS-REFERENCES TO RELATED APPLICATIONS

The present application is a continuation application to PCT Application No. PCT/CN2018/106347, filed on Sep. 19, 2018, which claims priority to Chinese Patent Application No. 201810469474.9, filed on May 16, 2018. Both applications are incorporated by reference herein for all purposes.

TECHNICAL FIELD

The present application relates to the field of display technology.

BACKGROUND

Organic Light Emitting Display (OLED) is an active light-emitting display device, and because it has advantages such as high contrast ratio, wide viewing angle, low power consumption and thinner volume, as well as being able to be manufactured by inkjet printing technology and roll-to-roll art and being easy to realize flexible display, OLED is one of the technologies receiving the most attention in the panel display technology field nowadays. Existing OLED devices have been inadequate, which is explained below, and new devices and techniques are desired.

SUMMARY

Therefore, a technical problem to be solved by the present application is the OLED devices in prior art do not have a large enough color gamut area.

In order to solve the above technical problem, the present application uses the following technical solution:

The present application proposes an organic electroluminescent device that comprises a plurality of kinds of light-emitting units having different light-emitting wavelengths, wherein the light-emitting units are organic light-emitting diodes, the organic light-emitting diodes comprise a plurality of single-colored organic light-emitting diodes and/or a plurality of white-light organic light-emitting diodes provided with optical filters;

at least one kind of the organic light-emitting diodes has a microcavity structure;

a microcavity optical length $L_i$ of the organic light-emitting diode having the microcavity structure and a light-emitting wavelength $\lambda i_i$ of the corresponding light-emitting unit meet the following formula:

$$L_i = n_i \lambda_i$$

wherein $n_i \geq 2$, $n_i$ is a positive integer, and the $n_i$ corresponds to at least one of the m kinds of light-emitting units having different light-emitting wavelengths $\lambda_i$ is larger than or equal to 3; $m \geq i \geq 1$, i and m are positive integers.

Optionally, m is 3, $\lambda_1 > \lambda_2 > \lambda_3$, and $n_2 > n_1$, $n_2 > n_3$.

Optionally, 577 nm$\geq \lambda_2 \geq$492 nm, and $n_2 \geq 3$.

Optionally, 760 nm$\geq \lambda_1 \geq$600 nm, and 480 nm$\geq \lambda_3 \geq$435 nm.

Optionally, each of the organic light-emitting diodes comprises a first electrode layer, a light-emitting layer and a second electrode layer stacked one by one, and the microcavity structure is formed between the first electrode layer and the second electrode layer.

Optionally, thicknesses $H_i$ of the light-emitting layers of the organic light-emitting diodes having different light-emitting wavelengths meet the following formula: $H_2 > H_1$, $H_2 > H_3$.

Optionally, at least one kind of the organic light-emitting diodes has at least 2 light-emitting layers, two adjacent light-emitting layers having a connection layer provided therebetween.

Optionally, the connection layer is a transparent layer and comprises a single layer or a multi-layer stacked composite structure formed by one or more materials selected from $Li_2CO_3$, HAT-CN, TAPC, TAPC doped with HAT-CN, Ag and ITO.

Optionally, the connection layer has a thickness of 5 nm-100 nm.

Optionally, the connection layer has a refractive index of 1.6-2.2.

Optionally, the light-emitting layer of at least one kind of the organic light-emitting diodes contains a thermal activated delayed fluorescent material.

Optionally, the light-emitting layer comprises a host material and a guest material, the host material comprises at least one kind of thermal activated delayed fluorescent material, and the guest material is a fluorescent material.

Optionally, the host material comprises two kinds of thermal activated delayed fluorescent materials that form an exciplex.

Optionally, the thermal activated delayed fluorescent materials are selected from 4CzIPN, 2CzPN, 4CzPN, 4CzTPN, 4CzTPN-Me, 4CzTPN-Ph; and the fluorescent material is selected from Alq3, C545T, DPVBi, DCJTB.

Optionally, the microcavity structure of at least one kind of the organic light-emitting diodes is also provided with an optical compensation layer.

Optionally, the optical compensation layer is at least one selected from a hole injection layer, a hole transport layer, an electron blocking layer, a hole blocking layer, an electron transport layer and an electron injection layer.

Optionally, the first electrode layer of at least one kind of the organic light-emitting diodes is a reflective electrode layer, and the second electrode layer of the corresponding organic light-emitting diode is a semi-reflective semi-transparent electrode layer.

Optionally, not all the thicknesses of the reflective electrode layers of the respective organic light-emitting diodes having different light-emitting wavelengths are the same.

Optionally, each of the reflective electrode layers comprises a reflective layer and an anode layer stacked on the reflective layer; not all the thicknesses of the anode layers of the organic light-emitting diodes are the same, the reflective layers have the same thickness.

Optionally, the reflective layer is a metal material layer, and the anode layer is a high work function layer.

Optionally, the reflective layer is a metal silver layer, and the anode layer is an ITO layer.

Optionally, the semi-reflective semi-transparent electrode layer comprises at least two layers of metal oxide layer and/or metal layer stacked in sequence.

Optionally, the metal oxide layer is selected from $MoO_3$, $WO_3$, IZO; and the metal layer is selected from Ag, Mg.

Optionally, the semi-reflective semi-transparent electrode layer has a light transmittance no less than 15%.

Optionally, the semi-reflective semi-transparent electrode layer has a refractive index higher than 1 and lower than 2.

The technical solution of the present application has the following advantages:

The organic electroluminescent device provided by embodiments of the present application comprises a plurality of kinds of light-emitting units having different light-emitting wavelengths, so the plurality of kinds of different light-emitting wavelengths are mixed together to realize full-color display. Wherein, the light-emitting units are single-colored organic light-emitting diodes and/or white-light organic light-emitting diodes provided with optical filters, that is to say, it may be composed of multiple kinds of single-colored organic light-emitting diodes having different light-emitting wavelengths, so as to realize full-color display; it may also be composed of a plurality of white-light organic light-emitting diodes filtered by optical filters to output light of different wavelengths, so as to be mixed into full-color display; it may also be composed of single-colored organic light-emitting diodes having different light-emitting wavelengths together with white-light organic light-emitting diodes, so as to realize full-color display. Therefore, it is applicable to different organic light-emitting diodes and has a wide range of use.

For the plurality of kinds of organic light-emitting diodes having different light-emitting wavelengths, a microcavity optical length $L_i$ of the organic light-emitting diode thereof having a microcavity structure and a corresponding light-emitting wavelength $\lambda_i$ meet the following relation formula:

$$L_i = n_i \lambda_i$$

wherein $n_i \geq 2$, $n_i$ is a positive integer, and the $n_i$ corresponds to at least one of the plurality of kinds of light-emitting units having different light-emitting wavelengths $\lambda_i$ is larger than or equal to 3; m is the number of the kinds of the light-emitting units, $m \geq i \geq 1$, i and m are positive integers.

In the microcavity of the organic light-emitting diode, when the microcavity optical length and the light-emitting wavelength are at the same order of magnitude, the light with a particular wavelength would be selectively enhanced, so as to realize narrowing of light spectrum, thereby producing the microcavity effect.

In the organic electroluminescent device provided by embodiments of the present application, the microcavity optical length $L_i$ of the organic light-emitting diode having a microcavity structure is $n_i$ times of the corresponding light-emitting wavelength, therefore, a $n_i$-order microcavity effect can be realized in all the organic light-emitting diodes having the microcavity structure, and $n_i$ is a positive integer greater than or equal to 2, so that a second-order microcavity, a third-order microcavity, a fourth-order microcavity or a higher order microcavity can be realized, thereby enhancing the microcavity effect and further narrowing the light spectrum, so as to increase the color gamut area.

In the organic electroluminescent device provided by embodiments of the present application, m is 3, $\lambda_1 > \lambda_2 > \lambda_3$, thus, the organic electroluminescent device comprises organic light-emitting diodes having three kinds of light-emitting wavelengths, and these three kinds of wavelengths have monochromaticity respectively, for example, $\lambda_1$ is a red light wavelength, $\lambda_2$ is a green light wavelength and $\lambda_3$ is a blue light wavelength, so that full-color display is realized by the traditional three primary colors.

Wherein, $n_2 > n_1$, $n_2 > n_3$, thus, the intensity of microcavity effect of the organic light-emitting diodes corresponding to green light is larger than the intensity of microcavity effect of the organic light-emitting diodes corresponding to red light and blue light. This is because the chromatic coordinate of the blue light unit itself is relatively close to the blue light chromatic coordinate with a high standard of color gamut, and the red light unit can realize extension of color gamut by spectral red shift, but the green light unit cannot realize extension of color gamut like the red light unit and the blue light unit, due to its own limitations. Therefore, the embodiments of the present application emphasize on enhancing the microcavity effect of the green light unit, so as to match the high color gamut of the red light unit and the blue light unit, thereby realizing high color gamut of the entire organic electroluminescent device.

In the organic electroluminescent device provided by embodiments of the present application, 577 nm$\geq \lambda_2 \geq$492 nm, and $n_2 \geq 3$, thus, the microcavity order of the organic light-emitting diodes having a green light wavelength is a third order or a higher order. By enhancing the intensity of microcavity effect of the green-light organic light-emitting diodes, their color gamut area is extended.

In the organic electroluminescent device provided by embodiments of the present application, each of the organic light-emitting diodes comprises a first electrode layer, a light-emitting layer and a second electrode layer stacked one by one, and because the first electrode layer and the second electrode layer have corresponding transmissive or reflective characteristics, the microcavity structure can be formed between the first electrode layer and the second electrode layer, so that the color gamut area is increased by enhancing the microcavity effect.

In the organic electroluminescent device provided by embodiments of the present application, thicknesses $H_i$ of the light-emitting layers of the respective organic light-emitting diodes having different light-emitting wavelengths meet the following formula: $H_2 > H_1$, $H_2 > H_3$. Thus, the light-emitting layer thickness of the organic light-emitting diodes corresponding to green light-emitting wavelength is pertinently adjusted to be larger than the light-emitting layer thickness of the organic light-emitting diodes corresponding to red light-emitting wavelength and also larger than the light-emitting layer thickness of the organic light-emitting diodes corresponding to blue light-emitting wavelength. By adjusting the light-emitting layer thickness so as to adjust the microcavity order, i.e. the intensity of microcavity effect, the color gamut area of the organic light-emitting diodes corresponding to green light-emitting wavelength is increased, thereby ensuring high color gamut of the entire organic electroluminescent device.

In the organic electroluminescent device provided by embodiments of the present application, at least one kind of the organic light-emitting diodes has at least 2 light-emitting layers. In one aspect, by increasing the number of the light-emitting layers, the microcavity dimension is increased, so as to increase the microcavity optical length and thus increase the intensity of microcavity effect. In another aspect, the luminous flux can be effectively increased, so as to increase the light-emitting efficiency of the organic light-emitting diodes.

In the organic electroluminescent device provided by embodiments of the present application, the light-emitting layer of at least one kind of the organic light-emitting diodes contains a thermal activated delayed fluorescent (TADF) material. In comparison with traditional material for the light-emitting layer, adding thermal activated delayed fluorescent material into the light-emitting layer helps to realize higher light-emitting efficiency and at the same time can ensure relatively high color purity.

In the organic electroluminescent device provided by embodiments of the present application, the microcavity structure of at least one kind of the organic light-emitting diodes is also provided with an optical compensation layer. Providing the optical compensation layer helps to increase the microcavity dimension of the corresponding organic light-emitting diode, which means the microcavity optical length is increased and thus the microcavity order is increased, so as to enhance the microcavity effect, thereby realizing narrowing of color spectrum and extension of color gamut area.

In the organic electroluminescent device provided by embodiments of the present application, the optical compensation layer is at least one selected from a hole injection layer, a hole transport layer, an electron blocking layer, a hole blocking layer, an electron transport layer and an electron injection layer. Thus, at the same time as realizing increase of the color gamut area, the transport efficiency of charge carriers is increased, so as to increase the light-emitting efficiency of the organic light-emitting diodes. Also, according to actual needs, one or two or more layers thereof can be provided, with strong flexibility and selectivity.

In the organic electroluminescent device provided by embodiments of the present application, not all the thicknesses of the reflective electrode layers of the respective organic light-emitting diodes having different light-emitting wavelengths are the same, thus, reflective electrode layers having different thicknesses can be provided according to properties (e.g. wavelength, light spectrum) of different emitted light, so as to adjust the optical distance travelled by the emitted light in the microcavity and thus realize different intensities of microcavity effect corresponding to organic light-emitting diodes with different emitted light, thereby ensuring high color gamut and narrow light spectrum of the entire organic electroluminescent device.

In the organic electroluminescent device provided by embodiments of the present application, each of the reflective electrode layers comprises a reflective layer and an anode layer stacked on the reflective layer. The reflective layer and the anode layer together form the reflective electrode layer, in one aspect, this increases the thickness of the reflective electrode layer and adds to the optical distance, so as to enhance the microcavity effect; in another aspect, providing the reflective layer increases the reflective effect of the reflective electrode layer, so as to further enhance the microcavity effect.

In the organic electroluminescent device provided by embodiments of the present application, the semi-reflective semi-transparent electrode layer comprises at least two layers of metal oxide layer and/or metal layer stacked in sequence. Thus, by providing multiple layers of metal oxide layer and/or metal layer, the thickness of the semi-reflective semi-transparent electrode layer is increased and thus the optical distance is increased, so as to enhance the microcavity effect; also, as the semi-reflective semi-transparent electrode layer has a light transmittance no less than 15%, enough light output efficiency can be ensured.

BRIEF DESCRIPTION OF THE DRAWINGS

In order to more clearly describe the technical solutions in the specific embodiments of the present application or in the prior art, hereinafter, the appended drawings used for describing the specific embodiments or the prior art will be briefly introduced. Apparently, the appended drawings described below are only directed to some embodiments of the present disclosure, and for a person skilled in the art, without expenditure of creative labor, other drawings can be derived on the basis of these appended drawings.

REFERENCE SIGNS

1—organic light-emitting diode; 11—first electrode layer; 111—reflective layer; 112—anode layer; 12—light-emitting layer; 121—connection layer; 13—second electrode layer; 131—metal oxide layer; 132—metal layer; 15—optical compensation layer; 151—hole injection layer; 152—hole transport layer; 153—electron blocking layer; 154—hole blocking layer; 155—electron transport layer; 156—electron injection layer.

DETAILED DESCRIPTION OF THE INVENTION

Figure 1:
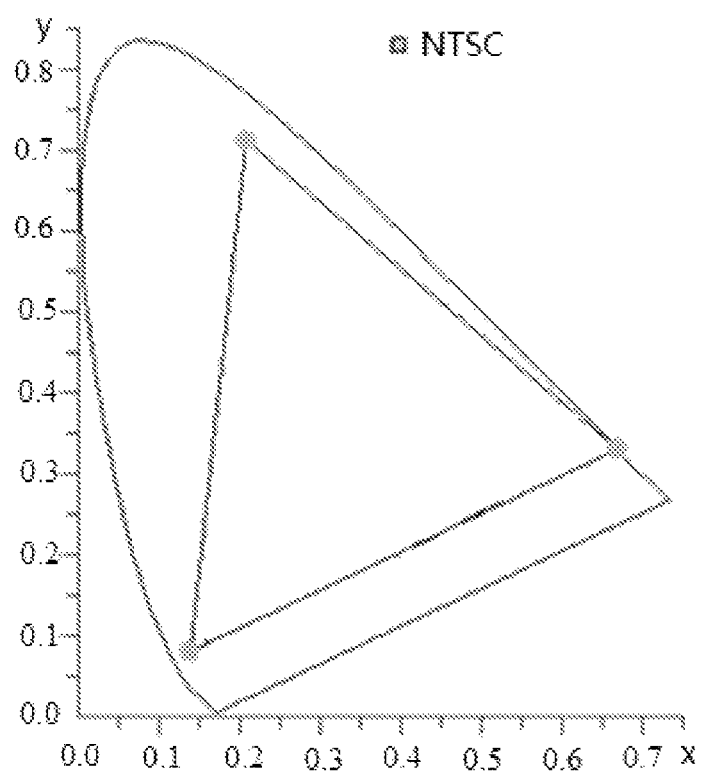
FIG. 1 is the NTSC color gamut map of the prior art.

Along with the ongoing development of OLED technology, increasingly high demands have been raised towards the performance of display devices. For example, increasing the color gamut area. The so-called color gamut area is a methodology of encoding the colors and refers to a sum of colors that can be generated by a technical system. FIG. 1 is a chromatic coordinate map formulated by NTSC (National Television Standards Committee of America), and a larger color gamut area, as it can be seen from the map, would bring more abundant display colors for the display device, so as to bring about better viewing experience.

In order to adapt to the development trend of the times, the prior art generally increases the color gamut area by means of increasing the color purity of the three primary colors. Specifically, the first way is synthesizing narrow-spectrum light-emitting material and utilizing the narrow-spectrum light-emitting material to increase the light-emitting color purity of the pixels; the second way is introducing quantum dots and utilizing the narrow-spectrum characteristic of the quantum dots to increase the color purity.

However, both of the above solutions have their own defects, for instance, in the first way, the design and synthesis of the organic light-emitting material requires large amount of work, has a low production yield and needs to go through a lot of experiments to verify the results, and thus has high cost of research and development; in the second way, although introducing the quantum dot technology can increase the color gamut area, it is essentially photoluminescence, not electroluminescent, with low light-emitting efficiency, besides, this method also increases the process complexity and has difficulty to realize high-density pixel arrangement.

A clear and complete description of the technical solution of the present application is given below, in conjunction with the appended drawings. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

In the description of the present application, it should be noted that, terms such as "first", "second" are merely for the purpose of description and are not to be construed as an indication or implication of relative importance thereof.

Furthermore, the technical features involved in the various embodiments of the present application described below can be combined with one another as long as they do not conflict with one another.

Figure 2A:
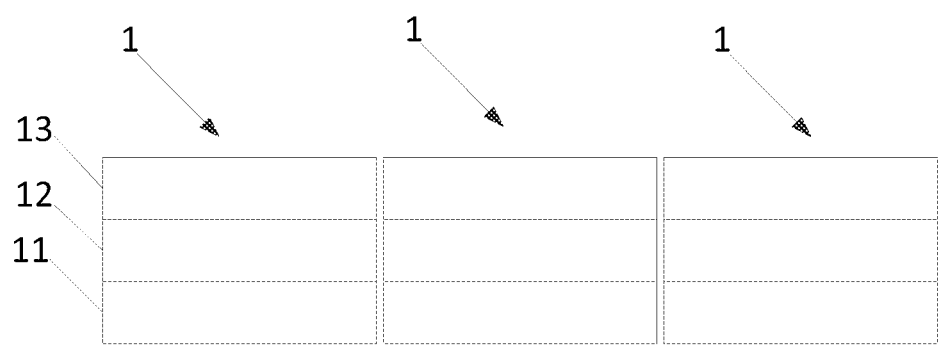
FIG. 2a is a structural schematic view of an implementation way of the organic electroluminescent device provided by the embodiments of the present application.
Figure 2B:
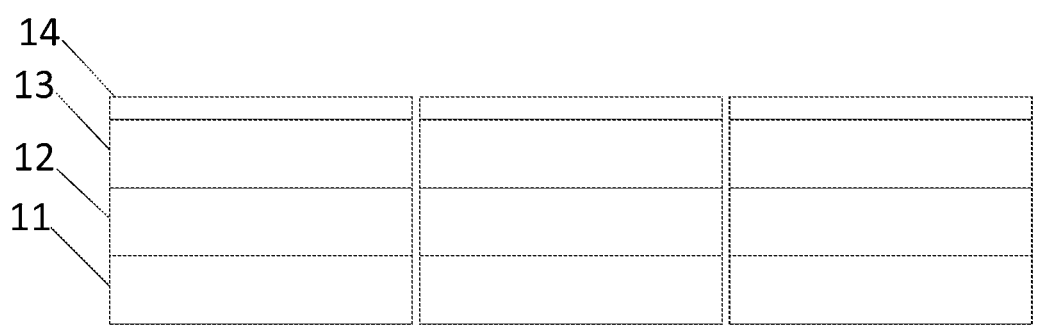
FIG. 2b is a structural schematic view of an implementation way of the organic electroluminescent device provided by the embodiments of the present application.

The embodiments of the present application provide an organic electroluminescent device that comprises a plurality of kinds of light-emitting units having different light-emitting wavelengths. The number of the kinds of light-emitting units having different light-emitting wavelengths is m. It is called m kinds of light-emitting units below. The light-emitting units are organic light-emitting diodes 1. The organic light-emitting diodes 1 comprise a plurality of single-colored organic light-emitting diodes 1 and/or white-light organic light-emitting diodes 1 provided with optical filters 14. According to the wavelengths of the light that needs to be outputted, the types of the optical filters are selected to be a red optical filter, a green optical filter or a blue optical filter. FIG. 2a shows a structure of the light-emitting units being single-colored organic light-emitting diodes 1. FIG. 2 shows a structure of the light-emitting units being white-light organic light-emitting diodes 1 provided with optical filters 14. A structure comprising both types thereof combined together may also be included.

Besides, at least one kind of the above-mentioned organic light-emitting diodes 1 has a microcavity structure.

For the m kinds of organic light-emitting diodes having different light-emitting wavelengths. A microcavity optical length $L_i$ of the organic light-emitting diode thereof having a microcavity structure and a corresponding light-emitting wavelength $\lambda_i$ meet the following formula:

$$L_i = n_i \lambda_i$$

wherein $n_i \geq 2$, $n_i$ is a positive integer, and the $n_i$ corresponds to at least one of the m kinds of light-emitting units having different light-emitting wavelengths; $\lambda_i$ is larger than or equal to 3; $m \geq i \geq 1$, i and m are positive integers.

The organic electroluminescent device provided by embodiments of the present application comprises m kinds of light-emitting units having different light-emitting wavelengths, so m kinds of different light-emitting wavelengths are mixed together to realize full-color display. There are single-colored organic light-emitting diodes having different light-emitting wavelengths or white-light organic light-emitting diodes provided with optical filters, that is to say, it may be composed of multiple kinds of single-colored organic light-emitting diodes having different light-emitting wavelengths, so as to realize full-color display. It may also include a plurality of white-light organic light-emitting diodes filtered by optical filters to output light of different wavelengths, so as to be mixed into full-color display. It may also include a plurality of single-colored organic light-emitting diodes having different light-emitting wavelengths together with white-light organic light-emitting diodes, so as to realize full-color display. Therefore, it is applicable to different organic light-emitting diodes and has a wide range of use.

For the m kinds of organic light-emitting diodes having different light-emitting wavelengths, a microcavity optical length $L_i$ of the organic light-emitting diode thereof having a microcavity structure and a corresponding light-emitting wavelength $\lambda_i$ meet the following formula:

$$L_i = n_i \lambda_i$$

wherein $n_i \geq 2$, $n_i$ is a positive integer, and the $n_i$ corresponds to at least one of the m kinds of light-emitting units having different light-emitting wavelengths; $\lambda_i$ is larger than or equal to 3; $m \geq i \geq 1$, i and m are positive integers.

In the microcavity of the organic light-emitting diode, when the microcavity optical length and the light-emitting wavelength are at the same order of magnitude, the light with a particular wavelength would be selectively enhanced, so as to realize narrowing of light spectrum, thereby producing the microcavity effect.

In the organic electroluminescent device provided by embodiments of the present application, the microcavity optical length $L_i$ of the organic light-emitting diode having a microcavity structure is $n_i$ times of the corresponding light-emitting wavelength. Therefore, a $n_i$-order microcavity effect can be realized in all the organic light-emitting diodes having the microcavity structure, and $n_i$ is a positive integer greater than or equal to 2, so that a second-order microcavity, a third-order microcavity, a fourth-order microcavity or a higher order microcavity can be realized, thereby enhancing the microcavity effect and further narrowing the light spectrum, so as to increase the color gamut area.

Preferably, not all the $n_i$ values are the same, thus, not all the order, i.e. intensity, of microcavity effect in the respective organic light-emitting diodes are the same, so that different orders of microcavity effect can be set according to properties (e.g. wavelength, light spectrum) of different emitted light, thereby realizing the optimal effect of light spectrum narrowing and the optimal color gamut area.

As an optional embodiment, m is 3, $\lambda_1 > \lambda_2 > \lambda_3$, and $n_2 > n_1$, $n_2 > n_3$.

As an optional embodiment, i=2 corresponds to green-light organic light-emitting diodes.

There are three kinds of wavelengths of emitted light included in the organic electroluminescent device, and these three kinds of wavelengths have monochromaticity respectively. For example, $\lambda_1$ is a red light wavelength with a wavelength range of 600 nm-760 nm; $\lambda_2$ is a green light wavelength with a wavelength range of 492 nm-577 nm; and $\lambda_3$ is a blue light wavelength with a wavelength range of 435 nm-480 nm, so that full-color display is realized by the traditional three primary colors. Within the same pixel unit, the number of organic light-emitting diodes 1 is normally three, respectively corresponding to the above-mentioned three kinds of wavelengths of emitted light; the number of organic light-emitting diodes 1 may also be more than three or fewer than three, and the way of permutation and combination thereof can be arranged according to actual needs, which is not specifically restricted herein. The related description below takes m=3 as an example.

Wherein, $n_2 > n_1$, $n_2 > n_3$, thus, the intensity of microcavity effect of the organic light-emitting diodes 1 corresponding to green-light light-emitting wavelength is larger than the intensity of microcavity effect of the organic light-emitting diodes 1 corresponding to red-light light-emitting wavelength, and is also larger than the intensity of microcavity effect of the organic light-emitting diodes 1 corresponding to blue-light light-emitting wavelength. This is because the chromatic coordinate of the blue light unit itself is relatively close to the blue light chromatic coordinate with a high standard of color gamut, and the red light unit can realize extension of color gamut by spectral red shift, but the green light unit cannot realize extension of color gamut like the red light unit and the blue light unit, due to its own limitations. Therefore, the embodiments of the present application emphasize on enhancing the microcavity effect of the green light unit, so as to match the high color gamut of the red light unit and the blue light unit, thereby realizing high color gamut of the entire organic electroluminescent device.

For example, the microcavity order of the organic light-emitting diodes corresponding to green-light light-emitting wavelength may be set as a third order, the microcavity order of the organic light-emitting diodes corresponding to red-light light-emitting wavelength and the microcavity order of the organic light-emitting diodes corresponding to blue-light light-emitting wavelength are both set as a second order; or, the microcavity order of the organic light-emitting diodes corresponding to green-light light-emitting wavelength may be set as a fourth order, the microcavity order of the organic light-emitting diodes corresponding to red-light light-emitting wavelength may be set as a third order, the microcavity order of the organic light-emitting diodes corresponding to blue-light light-emitting wavelength may be set as a second order. Particular settings can be made according to actual needs, which is not redundantly restricted herein.

As an optional embodiment, 577 nm$\geq \lambda_2 \geq$492 nm, and $n_2 \geq 3$. Thus, the microcavity order of the organic light-emitting diodes corresponding to green light wavelength is a third order or a higher order. By enhancing the intensity of microcavity effect of the green-light organic light-emitting diodes, their color gamut area is enlarged.

As an optional embodiment, each of the organic light-emitting diodes 1 comprises a first electrode layer 11, a light-emitting layer 12 and a second electrode layer 13 stacked one by one. The microcavity structure is formed between the first electrode layer 11 and the second electrode layer 13.

The optical length L specifically refers to the distance travelled in the process of the light emitted from the light-emitting layer being reflected by the first electrode layer and then being reflected by the second electrode layer and finally returning to its initial position, plus the equivalent distance generated by reflection phase shift of the first electrode layer and the second electrode layer. The travelled distance is generally twice the sum of the products of a determined thickness of each layer multiplying the corresponding refractive index. The determined thickness of each layer refers to a thickness, at which the light transmits through each of the first electrode layer 11, the light-emitting layer 12 and the second electrode layer 13.

Because the first electrode layer and the second electrode layer have corresponding transmissive or reflective characteristics, the microcavity structure can be formed between the first electrode layer and the second electrode layer, so that the color gamut area is increased by enhancing the microcavity effect.

When the organic light-emitting diodes 1 are single-colored organic light-emitting diodes, the light-emitting layer 12 is a single-colored light-emitting layer, for example, a red light-emitting layer or a blue light-emitting layer or a green light-emitting layer. When the organic light-emitting diodes 1 are white-light organic light-emitting diodes provided with optical filters 14, the light-emitting layer is a stacked structure formed by stacking three light-emitting tiers of red, green and blue, so that the light-emitting layer 12 emits white light, and after the white light is filtered by the respective optical filters 14 arranged thereon to output light of particular wavelengths, multicolor light-emitting can be realized.

Figure 3:
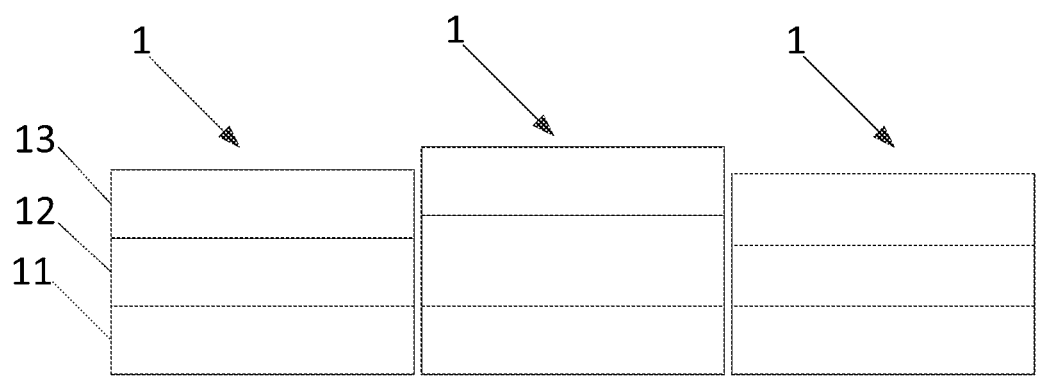
FIG. 3 is a structural schematic view of an implementation way of the organic electroluminescent device provided by the embodiments of the present application.

As an optional embodiment, as shown in FIG. 3, thicknesses $H_t$ of the light-emitting layers 12 of the respective organic light-emitting diodes 1 having different light-emitting wavelengths meet the following formula: $H_2 > H_1$, $H_2 > H_3$. Thus, the light-emitting layer thickness of the organic light-emitting diodes 1 corresponding to green light-emitting wavelength is pertinently adjusted to be larger than the light-emitting layer thickness of the organic light-emitting diodes corresponding to red light-emitting wavelength and also larger than the light-emitting layer thickness of the organic light-emitting diodes corresponding to blue light-emitting wavelength. By adjusting the light-emitting layer thickness so as to adjust the microcavity order, i.e. the intensity of microcavity effect, the color gamut area of the organic light-emitting diodes corresponding to green light-emitting wavelength is increased, thereby ensuring high color gamut of the entire organic electroluminescent device.

Figure 4:
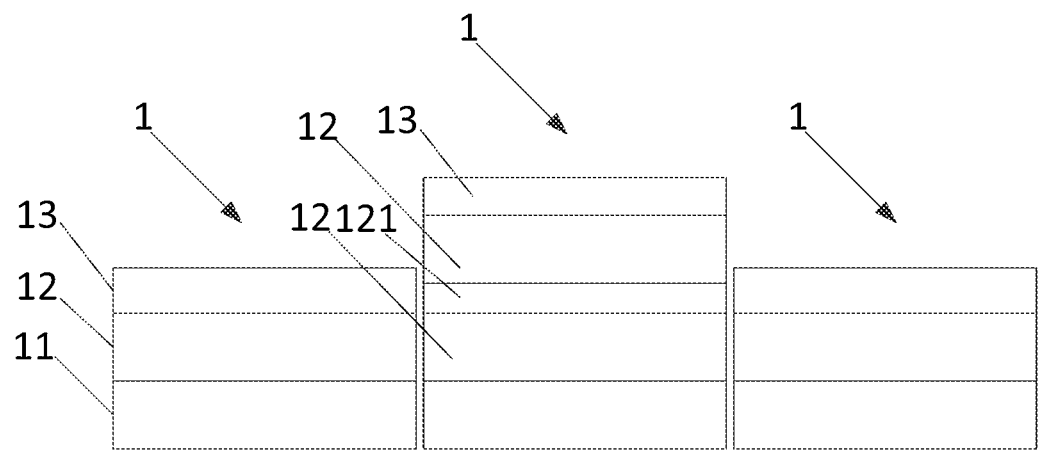
FIG. 4 is a structural schematic view of an implementation way of the organic electroluminescent device provided by the embodiments of the present application.

As an optional embodiment, as shown in FIG. 4, at least one kind of the organic light-emitting diodes has at least two light-emitting layers 12, with a connection layer 121 provided between the neighboring light-emitting layers 12. In one aspect, by increasing the number of the light-emitting layers, the microcavity dimension is increased, so as to increase the microcavity optical length and thus increase the intensity of microcavity effect. In another aspect, the luminous flux can be effectively increased, so as to increase the light-emitting efficiency of the organic light-emitting diodes.

For example, the number of light-emitting layers in the organic light-emitting diodes corresponding to green light-emitting wavelength is set to be 2, the numbers of light-emitting layers in the organic light-emitting diodes corresponding to red light-emitting wavelength and blue light-emitting wavelength are both set to be 1.

The connection layer 121 connecting the neighboring light-emitting layers 12 is a transparent layer and comprises a single layer or a multi-layer stacked composite structure formed by one or more materials selected from $Li_2CO_3$,2,3,6,7,10,11-hexocyanyl-1,4,5,8,9,12-hexaazobenzenephenanthrene (HAT-CN), 1,1'-bis-[4-(N,N'-bis-(p-toluenyl)-amino)-phenyl]-cyclohexane (TAPC), TAPC doped with HAT-CN (TAPC: HAT-CN), Ag and ITO.

For example, $Li_2CO_3$/HAT-CN/TAPC arranged in a stacked manner. The transparent connection layer 121 has a thickness of 5 nm-100 nm, and generally has a refractive index of 1.6-2.2.

As an optional embodiment, the light-emitting layer 12 of at least one kind of the organic light-emitting diodes 1 includes a thermal activated delayed fluorescent (TADF) material. In comparison with traditional material for the light-emitting layer, adding thermal activated delayed fluorescent (TADF) material into the light-emitting layer helps to realize higher light-emitting efficiency and at the same time can ensure relatively high color purity. In actual use, the thermal activated delayed fluorescent material may be added into the light-emitting layer corresponding to red light-emitting wavelength, the thermal activated delayed fluorescent material may also be added into the light-emitting layer corresponding to green light-emitting wavelength, and thermal activated delayed fluorescent material may also be added into the light-emitting layer corresponding to blue light-emitting wavelength.

In the present embodiment, the light-emitting layer comprises a host material and a guest material, the host material comprises at least one kind of thermal activated delayed fluorescent material, the guest material is a fluorescent material. Compared to the way of using fluorescent materials both as the host material and as the guest material of the light-emitting layer, the embodiments of the present application add thermal activated delayed fluorescent material into the host material and use fluorescent material as the guest material, the thermal activated delayed fluorescent material at room temperature can convert triplet excitons which initially do not emit light into singlet excitons which can be utilized to emit light, thereby increasing the light-emitting efficiency. Besides, due to the narrow light spectrum characteristic of the fluorescent material, it can be ensured that the organic electroluminescent device has narrow light spectrum, high color purity and large color gamut area.

As an optional embodiment, the host material comprises two kinds of thermal activated delayed fluorescent materials that form an exciplex. Thus, the light-emitting efficiency of the organic light-emitting diodes can be further increased. This is because the light-emitting layer uses fluorescent material as the guest material, and according to the direct capture luminescence mechanism, for the guest fluorescent material, a lot of triplet excitons cannot be effectively utilized, and the embodiments of the present application use two kinds of thermal activated delayed fluorescent materials as the host material wherein the two materials form an exciplex, so that the capture luminescence mechanism of the guest material can be inhibited, so as to increase the energy transfer efficiency, thereby further increasing the light-emitting efficiency.

The thermal activated delayed fluorescent materials are selected from, but not limited to, 2,4,5,6-tetra-(9-carbazolyl)-isophthalonitrile (4CzIPN), 4,5-bis-(9-carbazolyl)-phthalonitrile (2CzPN),
3,4,5,6-tetra-(9-carbazolyl)-phthalonitrile (4CzPN),
2,3,5,6-tetra-(9-carbazolyl)-terephthalonitrile (4CzTPN),
2,3,5,6-tetra-(3,6-dimethyl-9-carbazolyl)-terephthalonitrile (4CzTPN-Me),
2,3,5,6-tetra-(3,6-diphenyl-9-carbazolyl)-terephthalonitrile (4CzTPN-Ph); and the fluorescent material is selected from tris-(8-hydroxyquinoline)-aluminum (Alq3), coumarin 545T (C545T), 4,4'-bis-(2,2-diphenylvinyl)-1,1'-biphenyl (DPVBi), 4-(di-cyano-vinyl)-2-tertiary-butyl-6-(1,1,7,7-tetramethyl-mononidinyl-4-vinyl)-4H-pyran (DCJTB).

Figure 5:
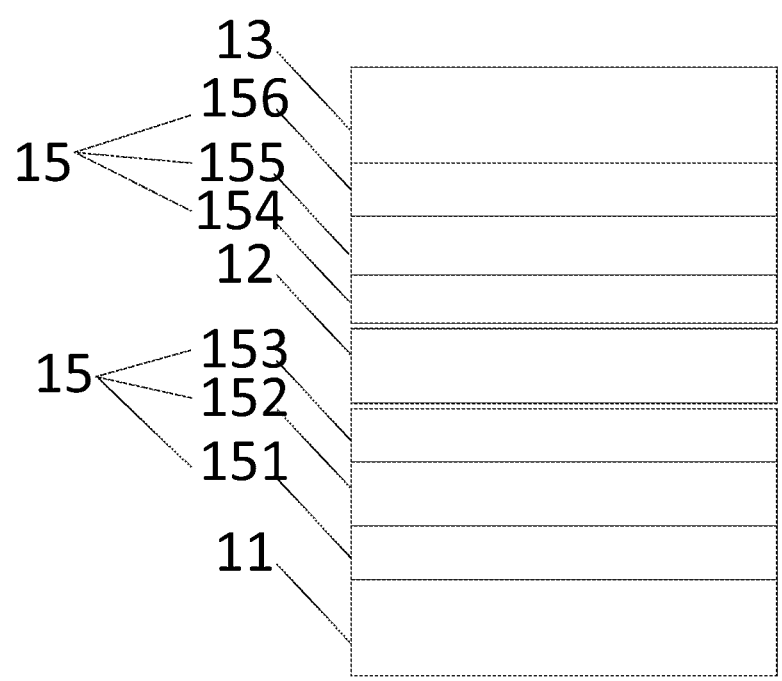
FIG. 5 is a structural schematic view of an implementation way of the organic electroluminescent device provided by the embodiments of the present application.

Optionally, as shown in FIG. 5, the microcavity structure of at least one kind of the organic light-emitting diodes 1 is also provided with an optical compensation layer 15. FIG. 5 only shows the structure of one organic light-emitting diode. Providing the optical compensation layer helps to increase the microcavity dimension of the corresponding organic light-emitting diode, which means the microcavity optical length is increased and thus the microcavity order is increased, so as to enhance the microcavity effect, thereby realizing narrowing of color spectrum and extension of color gamut area.

As an optional embodiment, as shown in FIG. 5, the optical compensation layer 15 is at least one selected from a hole injection layer 151, a hole transport layer 152, an electron blocking layer 153, a hole blocking layer 154, an electron transport layer 155 and an electron injection layer 156. Thus, it would not only increase the color gamut area, but also increase the transport efficiency of charge carriers, so as to increase the light-emitting efficiency of the organic light-emitting diodes. Also, according to actual needs, one or two or more layers thereof can be provided, it would improve flexibility and selectivity.

For example, when the first electrode layer 11 is anode and the second electrode layer 13 is cathode, one or more of a hole injection layer 151, a hole transport layer 152 and an electron blocking layer 153 are provided between the first electrode layer 11 and the light-emitting layer 12, and one or more of a hole blocking layer 154, an electron transport layer 155 and an electron injection layer 156 are provided between the light-emitting layer 12 and the second electrode layer 13.

It should be noted that, the microcavity dimension is further regulated by adjusting the thickness of the hole transport layer. This is because the thickness value of the hole transport layer has relatively little influence on the electrical performance of the organic light-emitting diode, so that good electrical performance can be ensured at the same time as adjusting the intensity of microcavity effect.

Optionally, the first electrode layer 11 is a reflective electrode layer, and the second electrode layer 13 is a semi-reflective semi-transparent electrode layer. Thus, by utilizing the reflective characteristic of the first electrode layer and the semi-reflective semi-transmissive characteristic of the second electrode layer, the microcavity structure can be formed between the first electrode layer and the second electrode layer.

Optionally, not all the thicknesses of the reflective electrode layers of the respective organic light-emitting diodes 1 having different light-emitting wavelengths are the same. Thus, reflective electrode layers having different thicknesses can be provided according to properties (e.g. wavelength, light spectrum) of different emitted light, so as to adjust the optical distance travelled by the emitted light in the microcavity and thus realize different intensities of microcavity effect corresponding to organic light-emitting diodes with different emitted light, thereby ensuring high color gamut and narrow light spectrum of the entire organic electroluminescent device.

Figure 6:
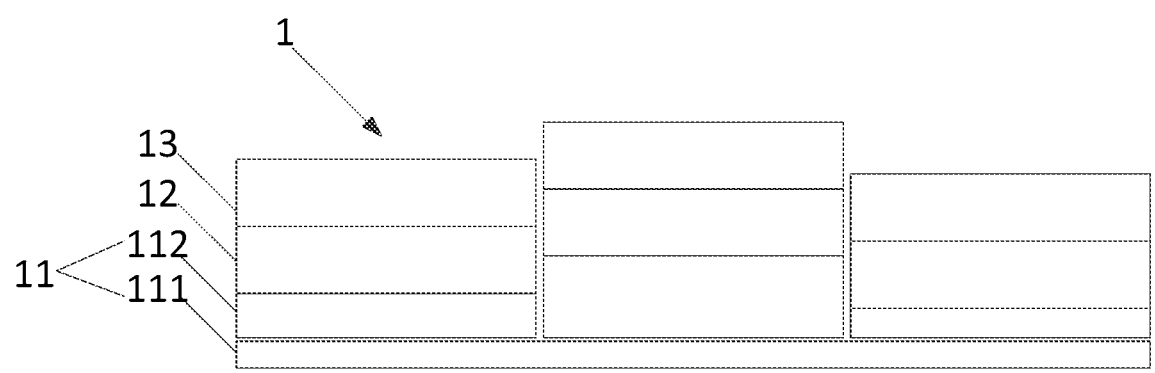
FIG. 6 is a structural schematic view of an implementation way of the organic electroluminescent device provided by the embodiments of the present application.

Optionally, as shown in FIG. 6, each of the reflective electrode layers comprises a reflective layer 111 and an anode layer 112 on the reflective layer 111. The reflective layer 111 and the anode layer 112 together form the reflective electrode layer. In one aspect, it increases the thickness of the reflective electrode layer and adds to the optical distance, so as to enhance the microcavity effect; in another aspect, providing the reflective layer 111 increases the reflective effect of the reflective electrode layer, so as to further enhance the microcavity effect.

In the present embodiment, not all the thicknesses of the anode layers 112 of the respective organic light-emitting diodes 1 having different light-emitting wavelengths are the same, the reflective layers 111 have the same thickness. Generally, the anode layer thickness of the organic light-emitting diodes corresponding to green light-emitting wavelength is set to be larger than the anode layer thicknesses of the organic light-emitting diodes corresponding to red light-emitting wavelength and blue light-emitting wavelength, so that the adjustment of microcavity dimension corresponding to the respective light-emitting wavelengths can be realized by adjusting the anode layer thickness.

The reflective layer 111 is a metal material layer, such as a metal silver layer; and the anode layer 112 is a high work function layer, such as an indium tin oxide (ITO) layer.

Figure 7:
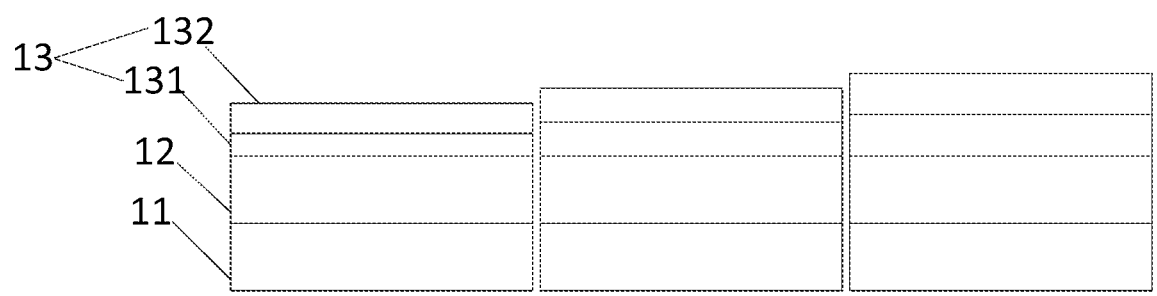
FIG. 7 is a structural schematic view of an implementation way of the organic electroluminescent device provided by the embodiments of the present application.

Optionally, as shown in FIG. 7, the semi-reflective semi-transparent electrode layer comprises at least two layers of metal oxide layer and/or metal layer stacked in sequence. Specifically, the semi-reflective semi-transparent electrode layer may comprise one metal oxide layer 131 and one metal layer 132. It may also comprise two metal oxide layers 131 stacked in sequence. It may also comprise one metal oxide layer 131, one metal layer 132 and one metal oxide layer 131 stacked in sequence; other combinations may also be possible, which are set according to actual needs. Thus, by providing multiple layers of metal oxide layer and/or metal layer, the thickness of the semi-reflective semi-transparent electrode layer is increased and thus the optical distance is increased, so as to enhance the microcavity effect.

In the present embodiment, the metal oxide layer 131 may be $MoO_3$, $WO_3$, or indium zinc oxide (IZO); the metal layer 132 may be Ag or Mg.

As an optional embodiment, the semi-reflective semi-transparent electrode layer has a light transmittance no less than 15% and a refractive index higher than 1 and lower than 2.

Embodiment 1

One embodiment of the present application provides a specific example of the organic electroluminescent device. The organic electroluminescent device in the present embodiment comprises three kinds of single-colored organic light-emitting diodes having different light-emitting wavelengths, respectively being red-light organic light-emitting diodes, green-light organic light-emitting diodes and blue-light organic light-emitting diodes. Wherein, the three kinds of organic light-emitting diodes all have microcavity structures. The second electrode layer has a light transmittance of 35%.

In the present embodiment, the red-light organic light-emitting diodes correspond to $\lambda_1=630$ nm, $n_i=2$, $L_1=1260$ nm;
the green-light organic light-emitting diodes correspond to $\lambda_2=520$ nm, $n_2=3$, $L_2=1560$ nm;
the blue-light organic light-emitting diodes correspond to $\lambda_3=460$ nm, $n_3=2$, $L_3=920$ nm;

The red-light organic light-emitting diodes in the present embodiment have the following device structure:
ITO(10 nm)/Ag(100 nm)/ITO(10 nm)/CuPc(20 nm)/TPD (200 nm)/CBP:Ir(piq)$_3$(3%,30 nm)/TPBi(40 nm)/LiF(1 nm)/Mg:Ag(20%,15 nm)/NPB(60 nm).

The green-light organic light-emitting diodes in the present embodiment have the following device structure:
ITO(10 nm)/Ag(100 nm)/ITO(10 nm)/CuPc(20 nm)/TPD (280 nm)/CBP:Ir(ppy)$_3$(10%,30 nm)/TPBi(40 nm)/LiF(1 nm)/Mg:Ag(20%,15 nm)/NPB(60 nm).

The blue-light organic light-emitting diodes in the present embodiment have the following device structure:
ITO(10 nm)/Ag(100 nm)/ITO(10 nm)/CuPc(20 nm)/TPD (110 nm)/CBP:DPVBi(3%,30 nm)/TPBi(40 nm)/LiF(1 nm)/Mg:Ag(20%,15 nm)/NPB(60 nm).

The thickness of the hole transport layer TPD of the green-light organic light-emitting diodes is thicker than the thicknesses of the hole transport layers TPD of the green-light organic light-emitting diodes and red-light organic light-emitting diodes.

Embodiment 2

One embodiment of the present application provides a specific example of the organic electroluminescent device. Its difference from the organic electroluminescent device provided by Embodiment 1 is that, the number of light-emitting layers of the green-light organic light-emitting diodes is two, and a connection layer is provided between the two light-emitting layers.

In the present embodiment, the green-light organic light-emitting diodes have the following device structure:
ITO(10 nm)/Ag(100 nm)/ITO(10 nm)/CuPc(20 nm)/TPD (90 nm)/CBP:Ir(ppy)$_3$(10%,30 nm)/TPBi(40 nm)/Li$_2$CO$_3$(1 nm)/HAT-CN(10 nm)/CuPc(20 nm)/TPD(90 nm)/CBP:Ir(ppy)$_3$(3%,30 nm)/TPBi(40 nm)/LiF(1 nm)/Mg:Ag(20%,15 nm)/NPB(60 nm).

Embodiment 3

One embodiment of the present application provides a specific example of the organic electroluminescent device. Its difference from the organic electroluminescent device provided by Embodiment 1 is that, the light-emitting layer of the green-light organic light-emitting diodes includes a thermal activated delayed fluorescent (TADF) material.

In the present embodiment, the green-light organic light-emitting diodes have the following device structure:
ITO(10 nm)/Ag(100 nm)/ITO(10 nm)/CuPc(20 nm)/TPD (280 nm)/4CzIPN:Ir(ppy)$_3$(10%,30 nm)/TPBi(40 nm)/LiF(1 nm)/Mg:Ag (20%,15 nm)/NPB(60 nm).

Embodiment 4

One embodiment of the present application provides a specific example of the organic electroluminescent device. Its difference from the organic electroluminescent device provided by Embodiment 1 is that:
the anode layer in the first electrode layer of the green-light organic light-emitting diodes is an optical compensation layer.

In the present embodiment, the green-light organic light-emitting diodes have the following device structure:
ITO(10 nm)/Ag(100 nm)/ITO(180 nm)/CuPc(20 nm)/TPD (100 nm)/CBP:Ir(ppy)$_3$(10%,30 nm)/TPBi(40 nm)/LiF(1 nm)/Mg:Ag(20%,15 nm)/NPB(60 nm).

Embodiment 5

One embodiment of the present application provides a specific example of the organic electroluminescent device. Its difference from the organic electroluminescent device provided by Embodiment 1 is that:
the second electrode layer of the organic light-emitting diodes having green light-emitting wavelength comprises three layers of metal oxide layer and metal layer stacked in sequence.

In the present embodiment, the green-light organic light-emitting diodes have the following device structure:
ITO(10 nm)/Ag(100 nm)/ITO(10 nm)/CuPc(20 nm)/TPD (280 nm)/CBP:Ir(ppy)$_3$(10%,30 nm)/TPBi(40 nm)/LiF(1 nm)/MoO$_3$(60 nm)/Mg:Ag(20%,10 nm)/MoO$_3$(60 nm).

Embodiment 6

One embodiment of the present application provides a specific example of the organic electroluminescent device. Its structure is similar to Embodiment 1, except that its second electrode layer is Mg:Ag having a thickness of 25 nm and a light transmittance of 15%.

Embodiment 7

One embodiment of the present application provides a specific example of the organic electroluminescent device. Its difference from the organic electroluminescent device provided by Embodiment 1 is that:

in the present embodiment, the red-light organic light-emitting diodes correspond to $\lambda_1$=630 nm, $n_1$=3, $L_1$=1890 nm;
the green-light organic light-emitting diodes correspond to $\lambda_2$=520 nm, $n_2$=4, $L_2$=2080 nm;
the blue-light organic light-emitting diodes correspond to $\lambda_3$=460 nm, $n_3$=2, $L_3$=920 nm;

The red-light organic light-emitting diodes in the present embodiment have the following device structure:
ITO(10 nm)/Ag(100 nm)/ITO(10 nm)/CuPc(20 nm)/TPD (380 nm)/CBP:Ir(piq)$_3$(3%,30 nm)/TPBi(40 nm)/LiF(1 nm)/Mg:Ag(20%,15 nm)/NPB(60 nm).

The green-light organic light-emitting diodes in the present embodiment have the following device structure:
ITO(10 nm)/Ag(100 nm)/ITO(10 nm)/CuPc(20 nm)/TPD (430 nm)/CBP:Ir(ppy)$_3$(10%,30 nm)/TPBi(40 nm)/LiF(1 nm)/Mg:Ag(20%,15 nm)/NPB(60 nm).

The blue-light organic light-emitting diodes in the present embodiment have the following device structure:
ITO(10 nm)/Ag(100 nm)/ITO(10 nm)/CuPc(20 nm)/TPD (110 nm)/CBP:DPVBi(3%,30 nm)/TPBi(40 nm)/LiF(1 nm)/Mg:Ag(20%,15 nm)/NPB(60 nm).

Embodiment 8

One embodiment of the present application provides a specific example of the organic electroluminescent device. Its difference from the organic electroluminescent device provided by Embodiment 1 is that:
the organic electroluminescent device is composed of white-light organic light-emitting diodes, with red optical filters, green optical filters and blue optical filters respectively arranged on the light exiting surface of the white-light organic light-emitting diodes.

In the present embodiment, the white-light organic light-emitting diodes have the following device structure:
Red-light unit:
ITO(10 nm)/Ag(100 nm)/ITO(100 nm)/CuPc(20 nm)/TPD (20 nm)/CBP:Ir(ppy)$_3$(15%):Ir(piq)$_3$(0.2%) (30 nm)/TPBi (30 nm)/Li$_2$CO$_3$(1 nm)/HAT-CN(10 nm)/CuPc(20 nm)/TPD (20 nm)/CBP:DPVBi(3%,30 nm)/TPBi(30 nm)/LiF(1 nm)/Mg:Ag (20%,15 nm)/NPB(60 nm).

Green-light unit:
ITO(10 nm)/Ag(100 nm)/ITO(180 nm)/CuPc(20 nm)/TPD (20 nm)/CBP:Ir(ppy)$_3$(15%):Ir(piq)$_3$(0.2%) (30 nm)/TPBi (30 nm)/Li$_2$CO$_3$(1 nm)/HAT-CN(10 nm)/CuPc(20 nm)/TPD (20 nm)/CBP:DPVBi(3%,30 nm)/TPBi(30 nm)/LiF(1 nm)/Mg:Ag(20%,15 nm)/NPB(60 nm).

Blue-light unit:
ITO(10 nm)/Ag(100 nm)/ITO(10 nm)/CuPc(20 nm)/TPD (20 nm)/CBP:Ir(ppy)$_3$(15%):Ir(piq)$_3$(0.2%) (30 nm)/TPBi (30 nm)/Li$_2$CO$_3$(1 nm)/HAT-CN(10 nm)/CuPc(20 nm)/TPD (20 nm)/CBP:DPVBi(3%,30 nm)/TPBi(30 nm)/LiF(1 nm)/Mg:Ag(20%,15 nm)/NPB(60 nm).

The red optical filters, green optical filters and blue optical filters respectively correspond to wavelengths of 630 nm, 522 nm and 456 nm.

Embodiment 9

One embodiment of the present application provides a specific example of the organic electroluminescent device. Its difference from the organic electroluminescent device provided by Embodiment 1 is that:
the red-light organic light-emitting diodes and the blue-light organic light-emitting diodes do not have a microcavity structure.

Comparison Example 1

The present comparison example provides an organic electroluminescent device with a device structure similar to Embodiment 1, except for the difference of $n_1$=$n_2$=$n_3$=2.

The red-light organic light-emitting diodes in the present comparison example have the following device structure:
ITO(10 nm)/Ag(100 nm)/ITO(10 nm)/CuPc(20 nm)/TPD (200 nm)/CBP:Ir(piq)$_3$(3%,30 nm)/TPBi(40 nm)/LiF(1 nm)/Mg:Ag(20%,15 nm)/NPB(60 nm).

The green-light organic light-emitting diodes in the present comparison example have the following device structure:
ITO(10 nm)/Ag(100 nm)/ITO(10 nm)/CuPc(20 nm)/TPD (130 nm)/CBP:Ir(ppy)$_3$(10%,30 nm)/TPBi(40 nm)/LiF(1 nm)/Mg:Ag(20%,15 nm)/NPB(60 nm).

The blue-light organic light-emitting diodes in the present comparison example have the following device structure:
ITO(10 nm)/Ag(100 nm)/ITO(10 nm)/CuPc(20 nm)/TPD (110 nm)/CBP:DPVBi(3%,30 nm)/TPBi(40 nm)/LiF(1 nm)/Mg:Ag(20%,15 nm)/NPB(60 nm).

Comparison Example 2

The present comparison example provides an organic electroluminescent device with a device structure similar to Embodiment 1, except for the difference of $n_1$=$n_2$=$n_3$=1.

The red-light organic light-emitting diodes in the present comparison example have the following device structure:
ITO(1 nm)/Ag(100 nm)/ITO(10 nm)/CuPc(20 nm)/TPD(20 nm)/CBP:Ir(piq)$_3$(3%,30 nm)/TPBi(40 nm)/LiF(1 nm)/Mg:Ag(20%,15 nm)/NPB(60 nm).

The green-light organic light-emitting diodes in the present comparison example have the following device structure:
ITO(10 nm)/Ag(100 nm)/ITO(10 nm)/CuPc(20 nm)/TPD (20 nm)/CBP:Ir(ppy)$_3$(10%,30 nm)/TPBi(40 nm)/LiF(1 nm)/Mg:Ag(20%,15 nm)/NPB(60 nm).

The blue-light organic light-emitting diodes in the present comparison example have the following device structure:
ITO(10 nm)/Ag(100 nm)/ITO(10 nm)/CuPc(20 nm)/TPD (20 nm)/CBP:DPVBi(3%,30 nm)/TPBi(40 nm)/LiF(1 nm)/Mg:Ag(20%,15 nm)/NPB(60 nm).

Comparison Example 3

The present comparison example provides an organic electroluminescent device with a device structure similar to Embodiment 1, except for the difference that the second electrode layer is Mg:Ag having a thickness of 40 nm and a light transmittance of 10%.

Tests are carried out on the performance of the aforementioned devices, and the test results are listed in the following table:

| group | $CIE_R$ (x,y) | $CIE_G$ (x,y) | $CIE_B$ (x,y) | color gamut (%NTSC) | color gamut (%BT2020) | Red light efficiency (cd/A) | Green light efficiency (cd/A) | Blue light efficiency (cd/A) |
|---|---|---|---|---|---|---|---|---|
| Embodiment 1 | 0.7, 0.3 | 0.16, 0.79 | 0.138, 0.046 | 130.4% | 97.4% | 40 | 101 | 6 |
| Embodiment 2 | 0.7, 0.3 | 0.16, 0.79 | 0.138, 0.046 | 130.4% | 97.4% | 39 | 213 | 6.1 |

-continued

| group | $CIE_R$ (x,y) | $CIE_G$ (x,y) | $CIE_B$ (x,y) | color gamut (%NTSC) | color gamut (%BT2020) | Red light efficiency (cd/A) | Green light efficiency (cd/A) | Blue light efficiency (cd/A) |
|---|---|---|---|---|---|---|---|---|
| Embodiment 3 | 0.7, 0.3 | 0.16, 0.79 | 0.138, 0.046 | 130.4% | 97.4% | 41 | 98 | 5.9 |
| Embodiment 4 | 0.7, 0.3 | 0.16, 0.79 | 0.138, 0.046 | 130.4% | 97.4% | 41 | 102 | 5.8 |
| Embodiment 5 | 0.701, 0.299 | 0.16, 0.792 | 0.138, 0.045 | 131.2% | 97.9% | 40 | 100 | 6 |
| Embodiment 6 | 0.705, 0.295 | 0.165, 0.792 | 0.135, 0.043 | 132.5% | 99.0% | 43 | 106 | 5.5 |
| Embodiment 7 | 0.708, 0.292 | 0.17, 0.792 | 0.138, 0.046 | 131.9% | 98.5% | 43 | 106 | 5.9 |
| Embodiment 8 | 0.700, 0.3 | 0.16, 0.77 | 0.136, 0.05 | 126.4% | 94.4% | 18 | 62 | 3.6 |
| Embodiment 9 | 0.62, 0.34 | 0.16, 0.79 | 0.131, 0.07 | 110.6% | 82.9% | 30 | 92 | 5.1 |
| Comparison Example 1 | 0.7, 0.3 | 0.17, 0.75 | 0.138, 0.046 | 122.5% | 91.5% | 40 | 125 | 6 |
| Comparison Example 2 | 0.68, 0.32 | 0.17, 0.72 | 0.131, 0.06 | 111.3% | 83.1% | 30 | 90 | 5 |
| Comparison Example 3 | 0.706, 0.294 | 0.165, 0.791 | 0.135, 0.044 | 132.4% | 98.9% | 30 | 80 | 4.2 |

As can be seen from the data in the table above, the embodiments of the present application can significantly increase the color purity and the color gamut area by means of adjusting the microcavity optical length and using high-order microcavity structures, the improved color gamut areas of the devices approximate to 100% BT.2020, and high efficiency of the devices can be maintained at the same time.

Apparently, the aforementioned embodiments are merely examples illustrated for clearly describing the present application, rather than limiting the implementation ways thereof. For a person with ordinary skill in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present application.

The invention claimed is:

1. An organic electroluminescent device, comprising:
a plurality of kinds of light-emitting units having different light-emitting wavelengths, the light-emitting units being organic light-emitting diodes, the organic light-emitting diodes comprising a plurality of single-colored organic light-emitting diodes and/or a plurality of white-light organic light-emitting diodes provided with optical filters;
wherein at least one kind of the organic light-emitting diodes has a microcavity structure, a microcavity optical length $L_i$ of the organic light-emitting diode having the microcavity structure and a light-emitting wavelength $\lambda_i$ of the corresponding light-emitting unit meet the following formula:

$$L_i = n_i \lambda_i$$

wherein $n_i \geq 2$, $n_i$ is a positive integer, and the $n_i$ corresponds to at least one of the plurality of kinds of light-emitting units having different light-emitting wavelengths, $\lambda_i$ is larger than or equal to 3; m is the number of the kinds of the light-emitting units, $m \geq i \geq 1$, i and m are positive integers.

2. The organic electroluminescent device according to claim 1, wherein, m is 3, $\lambda 1 > \lambda 2 > \lambda 3$, and $n_2 > n_1$, $n_2 > n_3$.

3. The organic electroluminescent device according to claim 2, wherein, 577 nm $\geq \lambda_2 \geq$ 492 nm, and $n_2 \geq 3$.

4. The organic electroluminescent device according to claim 2, wherein, 760 nm $\geq \lambda 1 \geq$ 600 nm, and 480 nm $\geq \lambda 3 \geq$ 435 nm.

5. The organic electroluminescent device according to claim 1, wherein, each of the organic light-emitting diodes comprises a first electrode layer, a light-emitting layer and a second electrode layer stacked one by one, and the microcavity structure is formed between the first electrode layer and the second electrode layer.

6. The organic electroluminescent device according to claim 5, wherein, thicknesses $H_i$ of the light-emitting layers of the organic light-emitting diodes having different light-emitting wavelengths meet the following formula: $H_2 > H_1$, $H_2 > H_3$.

7. The organic electroluminescent device according to claim 5, wherein, at least one kind of the organic light-emitting diodes has at least 2 light-emitting layers, two adjacent light-emitting layers having a connection layer provided therebetween.

8. The organic electroluminescent device according to claim 7, wherein, the connection layer is a transparent layer and comprises a single layer or a multi-layer stacked composite structure formed by one or more materials selected from $Li_2CO_3$, HAT-CN, TAPC, TAPC doped with HAT-CN, Ag and ITO; the connection layer has a thickness of 5 nm-100 nm; the connection layer has a refractive index of 1.6-2.2.

9. The organic electroluminescent device according to claim 5, wherein, the light-emitting layer of at least one kind of the organic light-emitting diodes contains a thermal activated delayed fluorescent material.

10. The organic electroluminescent device according to claim 9, wherein, the light-emitting layer comprises a host material and a guest material, the host material comprises two kinds of thermal activated delayed fluorescent materials that form an exciplex, and the guest material is a fluorescent material.

11. The organic electroluminescent device according to claim 10, wherein, the thermal activated delayed fluorescent materials are selected from 4CzIPN, 2CzPN, 4CzPN, 4CzTPN, 4CzTPN-Me, and 4CzTPN-Ph; and the fluorescent material is selected from Alq3, C545T, DPVBi, and DCJTB.

12. The organic electroluminescent device according to claim 5, wherein, the microcavity structure of at least one kind of the organic light-emitting diodes is also provided with an optical compensation layer.

13. The organic electroluminescent device according to claim 12, wherein, the optical compensation layer is at least one selected from a hole injection layer, a hole transport layer, an electron blocking layer, a hole blocking layer, an electron transport layer and an electron injection layer.

14. The organic electroluminescent device according to claim 5, wherein, the first electrode layer of at least one kind of the organic light-emitting diodes is a reflective electrode layer, and the second electrode layer of the corresponding organic light-emitting diode is a semi-reflective semi-transparent electrode layer.

15. The organic electroluminescent device according to claim 14, wherein, not all the thicknesses of the reflective electrode layers of the respective organic light-emitting diodes having different light-emitting wavelengths are the same.

16. The organic electroluminescent device according to claim 15, wherein, each of the reflective electrode layers comprises a reflective layer and an anode layer stacked on the reflective layer; not all the thicknesses of the anode layers of the organic light-emitting diodes are the same, the reflective layers have the same thickness.

17. The organic electroluminescent device according to claim 16, wherein, the reflective layer is a metal material layer, and the anode layer is a high work function layer.

18. The organic electroluminescent device according to claim 14, wherein, the semi-reflective semi-transparent electrode layer comprises at least two layers of metal oxide layer and/or metal layer stacked in sequence.

19. The organic electroluminescent device according to claim 18, wherein, the metal oxide layer is selected from $MoO_3$, $WO_3$, and IZO; and the metal layer is selected from Ag and Mg.

20. The organic electroluminescent device according to claim 14, wherein, the semi-reflective semi-transparent electrode layer has a light transmittance no less than 15%.

* * * * *